(12) United States Patent
Ohira

(10) Patent No.: US 6,342,928 B1
(45) Date of Patent: Jan. 29, 2002

(54) RECEIVER HAVING A TUNING CIRCUIT WITH A SELECTABLE INPUT

(75) Inventor: Koji Ohira, Hirakata (JP)

(73) Assignees: Sanyo Electric Co., Ltd., Moriguchi; Sanyo Tuners Industries Co., Ltd., Daito, both of (JP)

(*) Notice: Subject to any disclaimer, the term of this patent is extended or adjusted under 35 U.S.C. 154(b) by 0 days.

(21) Appl. No.: 09/366,566

(22) Filed: Aug. 4, 1999

(51) Int. Cl.[7] .................................................. H04N 5/46
(52) U.S. Cl. ........................ 348/729; 348/731; 348/553
(58) Field of Search ................................ 348/729, 553, 348/731; 455/179.1, 180.1, 188.1, 191.1, 182.3

(56) References Cited

U.S. PATENT DOCUMENTS

| | | | | |
|---|---|---|---|---|
| 5,440,351 A | * | 8/1995 | Ichino | 348/729 |
| 5,710,993 A | * | 1/1998 | Brekelmans | 348/729 |
| 6,046,781 A | * | 4/2000 | LeRoy | 348/731 |
| 6,125,269 A | * | 9/2000 | Brekelmans | 455/180.1 |

* cited by examiner

*Primary Examiner*—Victor R. Kostak
(74) *Attorney, Agent, or Firm*—Armstrong, Westerman, Hattori, McLeland & Naughton, LLP

(57) ABSTRACT

A receiver includes two input terminals. A VHF broadcast signal over a 6-MHz band channel is inputted through one input terminal, while an FM broadcast signal over an approximate 100-kHz band channel is inputted through the other input terminal. The other input terminal is connected with a trap circuit for band width reduction. This trap circuit causes attenuation in signal components over channels close to a desired channel except that over the desired channel with a band of approximately 100 kHz. An analog switch inputs selectively the VHF broadcast signal and the FM broadcast signal attenuated in the signal components to a tuning circuit having a tuning band width of approximately 6 MHz. When an FM broadcast signal is selected, an FM broadcast signal only over a desired channel is outputted from the tuning circuit.

7 Claims, 6 Drawing Sheets

FIG. 3

(UNIT:MHz)

| CH. | | FREQ. RANGE | PICTURE fp | SOUND fs | LOCAL OSCI. fosc | |
|---|---|---|---|---|---|---|
| – | 1 | 90 – 96 | 91.25 | 95.75 | 150.00 | ⎫ |
| – | 2 | 96 – 102 | 97.25 | 101.75 | 156.00 | |
| – | 3 | 102 – 108 | 103.25 | 107.75 | 162.00 | |
| C13 | M1 | 108 – 114 | 109.25 | 113.75 | 168.00 | |
| C14 | M2 | 114 – 120 | 115.25 | 119.75 | 174.00 | |
| C15 | M3 | 120 – 126 | 121.25 | 125.75 | 180.00 | |
| C16 | M4 | 126 – 132 | 127.25 | 131.75 | 186.00 | VL |
| C17 | M5 | 132 – 138 | 133.25 | 137.75 | 192.00 | |
| C18 | M6 | 138 – 144 | 139.25 | 143.75 | 198.00 | |
| C19 | M7 | 144 – 150 | 145.25 | 149.75 | 204.00 | |
| C20 | M8 | 150 – 156 | 151.25 | 155.75 | 210.00 | |
| C21 | M9 | 156 – 162 | 157.25 | 161.75 | 216.00 | |
| C22 | M10 | 164 – 170 | 165.25 | 169.75 | 224.00 | ⎭ |
| – | 4 | 170 – 176 | 171.25 | 175.75 | 230.00 | ⎫ |
| – | 5 | 176 – 182 | 177.25 | 181.75 | 236.00 | |
| – | 6 | 182 – 188 | 183.25 | 187.75 | 242.00 | |
| – | 7 | 188 – 194 | 189.25 | 193.75 | 248.00 | |
| – | 8 | 192 – 198 | 193.25 | 197.75 | 252.00 | |
| – | 9 | 198 – 204 | 199.25 | 203.75 | 258.00 | |
| – | 10 | 204 – 210 | 205.25 | 209.75 | 264.00 | |
| – | 11 | 210 – 216 | 211.25 | 215.75 | 270.00 | |
| – | 12 | 216 – 222 | 217.25 | 221.75 | 276.00 | |
| C23 | S1 | 222 – 228 | 223.25 | 227.75 | 282.00 | |
| C24 | S2 | 230 – 236 | 231.25 | 235.75 | 290.00 | |
| C25 | S3 | 236 – 242 | 237.25 | 241.75 | 296.00 | VH |
| C26 | S4 | 242 – 248 | 243.25 | 247.75 | 302.00 | |
| C27 | S5 | 248 – 254 | 249.25 | 253.75 | 308.00 | |
| C28 | S6 | 252 – 258 | 253.25 | 257.75 | 312.00 | |
| C29 | S7 | 258 – 264 | 259.25 | 263.75 | 318.00 | |
| C30 | S8 | 264 – 270 | 265.25 | 269.75 | 324.00 | |
| C31 | S9 | 270 – 276 | 271.25 | 275.75 | 330.00 | |
| C32 | S10 | 276 – 282 | 277.25 | 281.75 | 336.00 | |
| C33 | S11 | 282 – 288 | 283.25 | 287.75 | 342.00 | |
| C34 | S12 | 288 – 294 | 289.25 | 293.75 | 348.00 | |
| C35 | S13 | 294 – 300 | 295.25 | 299.75 | 354.00 | ⎭ |

FIG. 4

(UNIT:MHz)

| CH. | | FREQ. RANGE | PICTURE fp | SOUND fs | LOCAL OSCI. fosc | |
|---|---|---|---|---|---|---|
| 2 | 2 | 54 – 60 | 55.25 | 59.75 | 101.00 | |
| 3 | 3 | 60 – 66 | 61.25 | 65.75 | 107.00 | |
| 4 | 4 | 66 – 72 | 67.25 | 71.75 | 113.00 | |
| 5A | 1 | 72 – 78 | 73.25 | 77.75 | 119.00 | |
| 5 | 5 | 76 – 82 | 77.25 | 81.75 | 123.00 | |
| 6 | 6 | 82 – 88 | 83.25 | 87.75 | 129.00 | |
| A-5 | 95 | 90 – 96 | 91.25 | 95.75 | 137.00 | |
| A-4 | 96 | 96 – 102 | 97.25 | 101.75 | 143.00 | |
| A-3 | 97 | 102 – 108 | 103.25 | 107.75 | 149.00 | |
| A-2 | 98 | 108 – 114 | 109.25 | 113.75 | 155.00 | V<sub>L</sub> |
| A-1 | 99 | 114 – 120 | 115.25 | 119.75 | 161.00 | |
| A | 14 | 120 – 126 | 121.25 | 125.75 | 167.00 | |
| B | 15 | 126 – 132 | 127.25 | 131.75 | 173.00 | |
| C | 16 | 132 – 138 | 133.25 | 137.75 | 179.00 | |
| D | 17 | 138 – 144 | 139.25 | 143.75 | 185.00 | |
| E | 18 | 144 – 150 | 145.25 | 149.75 | 191.00 | |
| F | 19 | 150 – 156 | 151.25 | 155.75 | 197.00 | |
| G | 20 | 156 – 162 | 157.25 | 161.75 | 203.00 | |
| H | 21 | 162 – 168 | 163.25 | 167.75 | 209.00 | |
| I | 22 | 168 – 174 | 169.25 | 173.75 | 215.00 | |
| 7 | 7 | 174 – 180 | 175.25 | 179.75 | 221.00 | |
| 8 | 8 | 180 – 186 | 181.25 | 185.75 | 227.00 | |
| 9 | 9 | 186 – 192 | 187.25 | 191.75 | 233.00 | |
| 10 | 10 | 192 – 198 | 193.25 | 197.75 | 239.00 | |
| 11 | 11 | 198 – 204 | 199.25 | 203.75 | 245.00 | |
| 12 | 12 | 204 – 210 | 205.25 | 209.75 | 251.00 | |
| 13 | 13 | 210 – 216 | 211.25 | 215.75 | 257.00 | |
| J | 23 | 216 – 222 | 217.25 | 221.75 | 263.00 | V<sub>H</sub> |
| K | 24 | 222 – 228 | 223.25 | 227.75 | 269.00 | |
| L | 25 | 228 – 234 | 229.25 | 233.75 | 275.00 | |
| M | 26 | 234 – 240 | 235.25 | 239.75 | 281.00 | |
| N | 27 | 240 – 246 | 241.25 | 245.75 | 287.00 | |
| O | 28 | 246 – 252 | 247.25 | 251.75 | 293.00 | |
| P | 29 | 252 – 258 | 253.25 | 257.75 | 299.00 | |
| Q | 30 | 258 – 264 | 259.25 | 263.75 | 305.00 | |
| R | 31 | 264 – 270 | 265.25 | 269.75 | 311.00 | |
| S | 32 | 270 – 276 | 271.25 | 275.75 | 317.00 | |
| T | 33 | 276 – 282 | 277.25 | 281.75 | 323.00 | |
| U | 34 | 282 – 288 | 283.25 | 287.75 | 329.00 | |
| V | 35 | 288 – 294 | 289.25 | 293.75 | 335.00 | |
| W | 36 | 294 – 300 | 295.25 | 299.75 | 341.00 | |

RECEIVER HAVING A TUNING CIRCUIT WITH A SELECTABLE INPUT

BACKGROUND OF THE INVENTION

1. Field of the Invention

The present invention relates to receivers and, more particularly, to a receiver which can perform tuning within a tuning band width related to a signal frequency band width for television broadcast.

2. Description of the Related Art

The signal frequencies of television broadcast lie within a band width largely different from that of the signal frequencies of radio broadcast. That is, almost all the television broadcast signals falls under a frequency band width of 6 MHz, whereas the radio broadcast signals are in a frequency band width as narrow as approximately 100 kHz. As a result, it has been a conventional practice to separately provide receivers for processing television and radio broadcast signals. In order to receive VHF television broadcasts, a television broadcast receiver 1a was required to include, as shown in FIG. 5, an input tuning circuit 2a, an RF amplifier 3a, an inter-stage tuning circuit 4a, a mixer 5a, a tuning circuit 6a, a local oscillation circuit 8a and an IF amplifier 7a. For receiving FM radio broadcast, a radio broadcast receiver 1b shown in FIG. 6 was required to have the similar circuits 2b–8b.

This however necessitate two circuits for each of signal processing, such as in tuning circuits and frequency conversion circuits, thus posing a problem of high cost.

SUMMARY OF THE INVENTION

Therefore, it is a primary object of the present invention to provide a receiver which can receive both television broadcast and radio broadcast.

A receiver according to the present invention, comprises: a tuning circuit having a first tuning band width; a first input terminal for inputting a first broadcast signal having a first frequency band width correlated to the first tuning band width; second input terminal for inputting a second broadcast signal having a second frequency band width narrower than the first frequency band width; an attenuation circuit for attenuating signal components of the second broadcast signal at around a desired channel; and a selection circuit for selecting and inputting to the tuning circuit one of the first broadcast signal and the second broadcast signal attenuated in the signal components.

According to this invention, inputted through the first terminal a first broadcast signal possessing a first frequency band width related to a first tuning band width while inputted through the second terminal a second broadcast signal having a second frequency band width narrower than the first tuning band width. The selection circuit selects one of the first broadcast signal and the second broadcast signal attenuated in signal components, and inputs it to the tuning circuit having a first tuning band width.

In one embodiment of the present invention, the attenuation circuit attenuates the signal components over the first frequency band width except for at the desired channel. Incidentally, the attenuation circuit includes a resonant circuit which resonates at frequency correlated to a tuning voltage.

In another embodiment of the present invention, the first broadcast signal is a television signal to be broadcast in a VHF band range, and the second broadcast signal is a radio signal to be FM broadcast in the VHF band range.

According to this invention, because attenuation is made for the second broadcast signal on signal components over the channel close to a desired channel, the second broadcast signal can be properly received even where the tuning means is broad in tuning band width. That is, proper reception is possible for both the first broadcast signal and the second broadcast signal.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a chart showing frequency bands, picture frequencies, sound frequencies and local oscillation frequencies for ground wave and CATV channels provided in the Japanese VHF band;

FIG. 4 is a chart showing frequency bands, video frequencies, sound frequencies and local oscillation frequencies for ground wave and CATV channels provided in the U.S.VHF band;

DETAILED DESCRIPTION OF THE PREFERRED EMBODIMENTS

Figure 1:
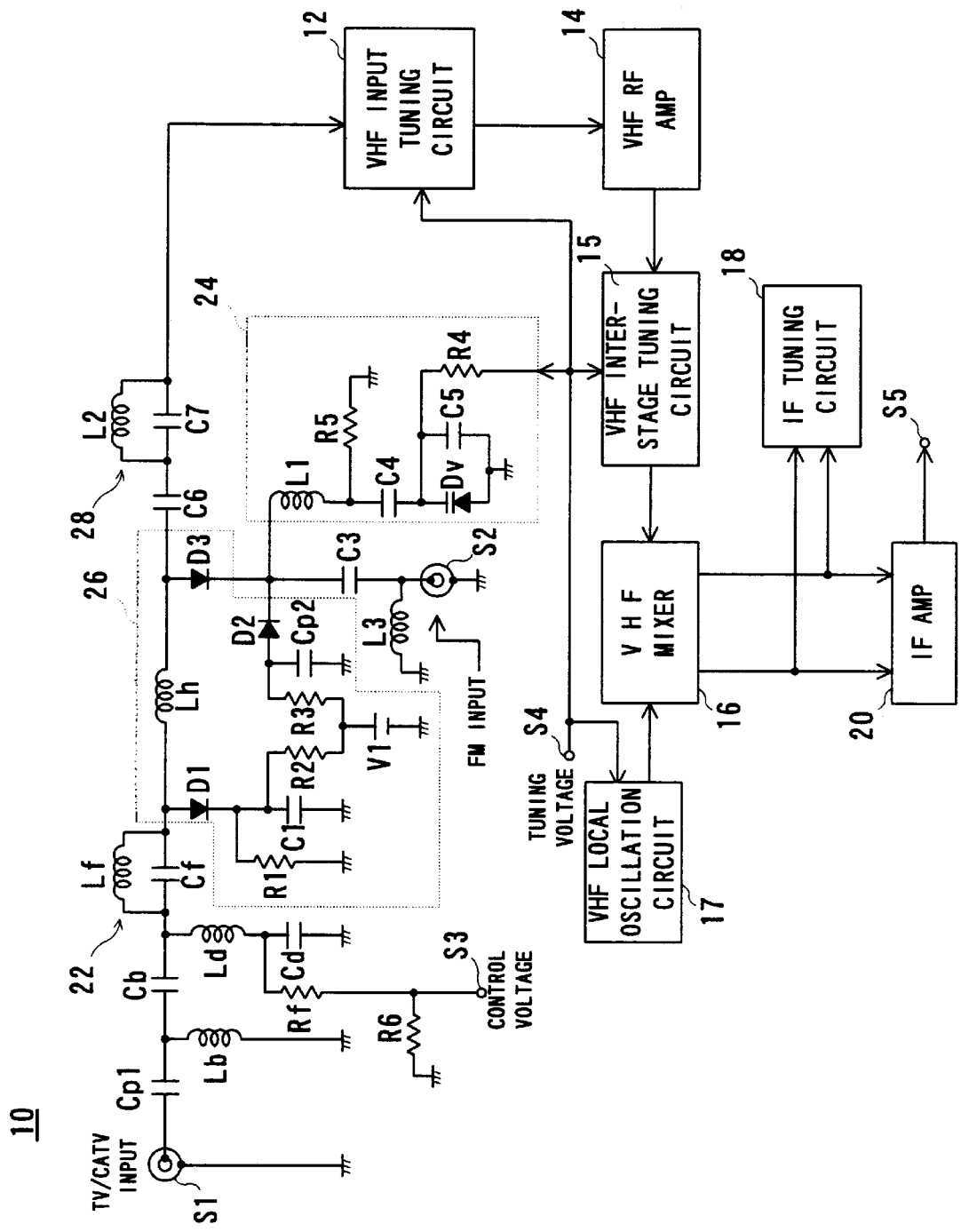
FIG. 1 is an illustrative view showing one embodiment of the present invention.

Referring to FIG. 1, a receiver 10 of this embodiment includes an input terminal S1 to input a ground wave television broadcast signal and CATV broadcast signal (hereinafter referred collectively to as "VHF television broadcast signal") to be broadcast over a TV channel provided within the VHF band, and an input terminal S2 to input a radio broadcast signal to be FM-broadcast (hereinafter referred to as "FM radio broadcast signal") over a radio channel provided within the VHF band. Note that the VHF band is defined as a frequency band of from 30 MHz–300 MHz. Meanwhile, the input terminal S1 is connected with a television antenna (not shown) and the input terminal S2 is with a radio antenna (not shown).

The input terminal S1 is connected with one end of a capacitor Cp1. The capacitor Cp1 has the other end connected with one end of a coil Lb grounded at the other end as well as one end of a capacitor Cb. The other end of the capacitor Cb is grounded through a coil Ld and capacitor Cd. The coil Ld and the capacitor Cd have a connection point grounded through resistors Rf and R6. Also, the resistors Rf and R6 have a connection point to which an input terminal S3 is connected to receive a control voltage.

The capacitor Cb at the other end is connected to one end of a coil Lh and an anode of a diode D1 through a parallel-connected coil Lf and capacitor Cf. The diode D1 has a cathode that is grounded via a resistor R1 and also grounded through a capacitor C1. The capacitor C1 has one end connected to one end of a capacitor Cp2 and an anode of a diode D2 through resistors R2 and R3. The resistors R2 and R3 has a connection point grounded through a direct current power source V1, while the other end of the capacitor Cp2 is directly grounded at the other end. The coil Lh has the other end connected to an anode of a diode D3, and the diode D3 and the diode D2 are connected at their cathodes with each other.

The cathode of the diode D3 is connected to the input terminal S2 through the capacitor C3. The capacitor C3 and the input terminal S2 has a connection point that is grounded through a coil L3. The cathode of the diode D3 is also grounded through a coil L1 and resistor R5. The coil L1 and the resistor R5 has a connection point that is grounded through a capacitor C4 and parallel-connected variable diode Dv and capacitor C5. Further, the capacitors C4 and C5 has a connection point that is connected to a tuning-voltage input terminal S4 through a resistor R4. Also, the coil Lh has the other end connected to a VHF input tuning circuit 12 through a capacitor C6 and parallel-connected coil L2 and capacitor C7.

The capacitors Cp1 and Cb as well as the coil Lb constitute a high-pass filter which removes direct-current and low-frequency components as other portions than a VHF television broadcast signal having been inputted through the input terminal S1. The capacitor Cb and coil Lb also cooperate with the coil Ld and capacitor Cd to form a π-type high-pass filter, which removes Cb wireless signals. The coil Lf and capacitor Cf form an FM trap circuit so that this FM trap circuit 22 can trap an FM radio broadcast signal broadcast over a radio channel adjacent to a TV channel. That is, in Japan ground wave television broadcast is implemented within a frequency band of 90 MHz–222 MHz while FM radio broadcast is within a frequency band of 76 MHz–90 MHz. Due to this, the coil Lf and capacitor Cf apply a trap to an FM radio broadcast signal in order not to contain noise when selecting a TV channel.

On the other hand, the capacitor C3 and coil L3 connected to the input terminal S2 form a high-pass filter to thereby remove direct-current and low-frequency components as other portions than an FM radio broadcast signal. Also, the coil L1, resistors R4 and R5, capacitors C4 and C5 and variable capacitance diode Dv constitute a trap circuit 24 for reducing a band width. The variable capacitance diode Dv has a capacitance value controlled by a tuning voltage, thereby varying the resonant frequency. The capacitor C4 is provided to cut off a cathode voltage of the variable capacitance diode Dv and a cathode voltage of the diodes D2 and D3 from each other, and has a large capacitance value. Due to this, the capacitance of the capacitor C4 is negligible at high frequencies. Consequently, provided that the capacitance value of the variable capacitance diode Dv is Cv, the resonant frequency Ft to be defined by the coil L1, capacitor C5 and variable capacitance diode Dv is expressed by Equation 1.

$$Ft = 1/[2\pi\sqrt{L1*(Cv+C5)}]$$ [Equation 1]

At a resonant frequency Ft, the trap circuit 24 is decreased in impedance so that a frequency component containing a resonant frequency Ft is allowed to flow through the trap circuit 24 to a ground surface. Consequently, attenuated are unwanted-channel FM radio broadcast signals at around the resonant frequency Ft as a center. Incidentally, the capacitor C5 is provided to correct for the resonant frequency.

The capacitor C6 is selectively inputted by a VHF television broadcast signal or an FM radio broadcast signal, in response to a control voltage applied to the input terminal S3. During receiving a VHF television broadcast signal, the input terminal S3 is given a control voltage of 0 volt. This decreases respective anode voltages of the diodes D1 and D3 lower than their cathode voltages. That is, the diode D1 at its cathode is connected to the direct current power source V1 through the resistor R2. The diode D3 at its cathode is connected to the direct current power source V1 through the diode D2 and resistor R3. Further, the diode D2 at its cathode is grounded through the coil L1 and resistor R5. Accordingly, if the resistor Rf as well as the resistors R1–R3 and R5 are set to proper resistance values, the diodes D1 and D3 become a non-conductive state while the diode D2 becomes a conductive state, in response to a 0-volt control voltage. Due to this, the FM radio broadcast signal flows through the diode D2 and capacitor Cp2 to the ground surface. On the other hand, the VHF television broadcast signal having passed through the FM trap circuit 22 is given to the capacitor C6 through the coil Lh. Incidentally, the coil Lh is set in order to attenuate higher frequencies than the VHF band.

During FM radio broadcast reception, a plus control voltage higher than the direct current power source V1 is applied to the input terminal S3. At this time, the diodes D1 and D3 become a conductive state while the diode D2 becomes a non-conductive state. Consequently, the VHF television broadcast signal having passed through the FM trap circuit 22 flows through the diode D1 and capacitor C1 to the ground surface. Meanwhile, the FM radio broadcast signal is given to the capacitor C6 through the diode D3. At this time, the coil Lh plays a role to block the VHF television broadcast signal from flowing toward the capacitor C6. The diode D2 also plays a role to prevent the FM radio broadcast signal from flowing toward the capacitor Cp2. As a consequence, the coil Lh may be replaced with a diode, and the diode D2 may be replaced by a coil. These diodes D1–D3 and coil Lh operate as an analog switch 26 to select one of a VHF television broadcast signal and an FM radio broadcast signal.

The capacitor C6 cut off the direct current component included in a VHF television broadcast signal or FM radio broadcast signal. Meanwhile, the coil L2 and capacitor C7 forms an IF (Intermediate Frequency) trap circuit 28 which traps an IF component contained in a VHF television broadcast signal or FM radio broadcast signal. Any of the broadcast signals having passed through the capacitor C6 and IF trap circuit 28 is given to a VHF input tuning circuit 12 having a tuning band of approximately 6 MHz.

As will be understood from FIG. 3, in Japan all the channels included within the VHF band (ground wave TV and CATV channels) possess a frequency band width of 6 MHz. On the contrary, the FM radio channels though not shown have a frequency band width of as narrow as 100 KHz. Consequently, if an FM radio broadcast signal be inputted as it is to the VHF input tuning circuit 12, tuning is applied to over unwanted FM radio channels thereby making it impossible to listen to an FM radio broadcast. Therefore, this embodiment is provided with the trap circuit 24 in order to remove signals to be broadcast over the channels adjacent to a desired FM radio channel. By properly setting an inductance value for the coil L1 and capacitance values for the capacitor C5 and variable capacitance diode Dv, the VHF input tuning circuit 12 can apply tuning only to a desired TV channel or radio channel.

Figure 2:
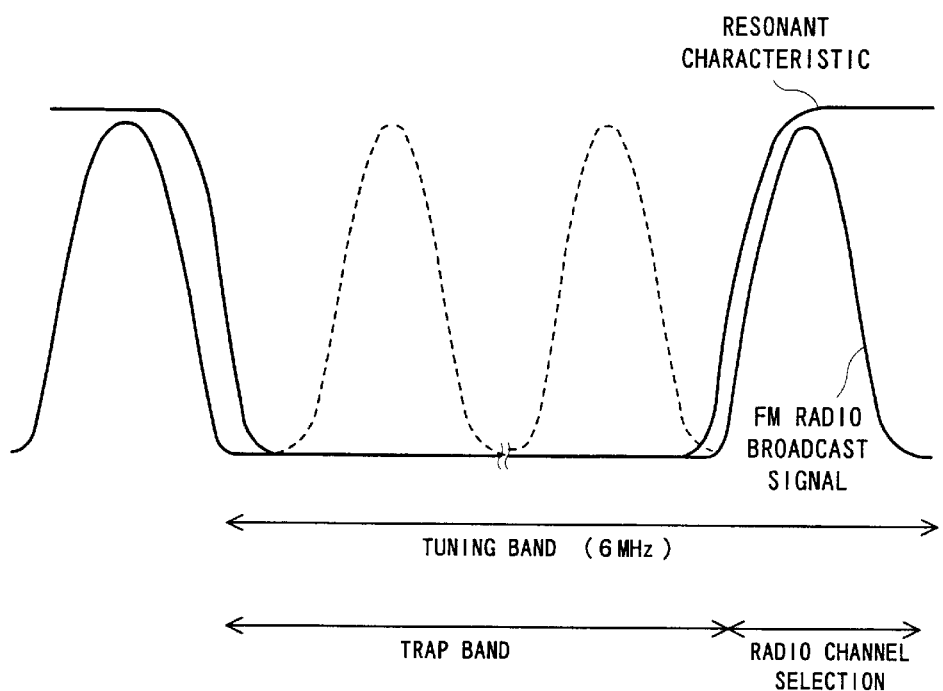
FIG. 2 is an illustrative view showing part of operation in the FIG. 1 embodiment.
Figure 2:
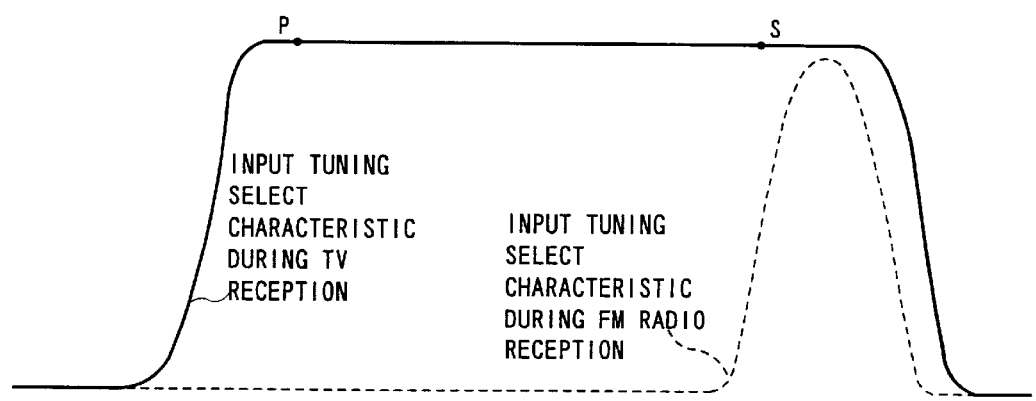
Figure 5:
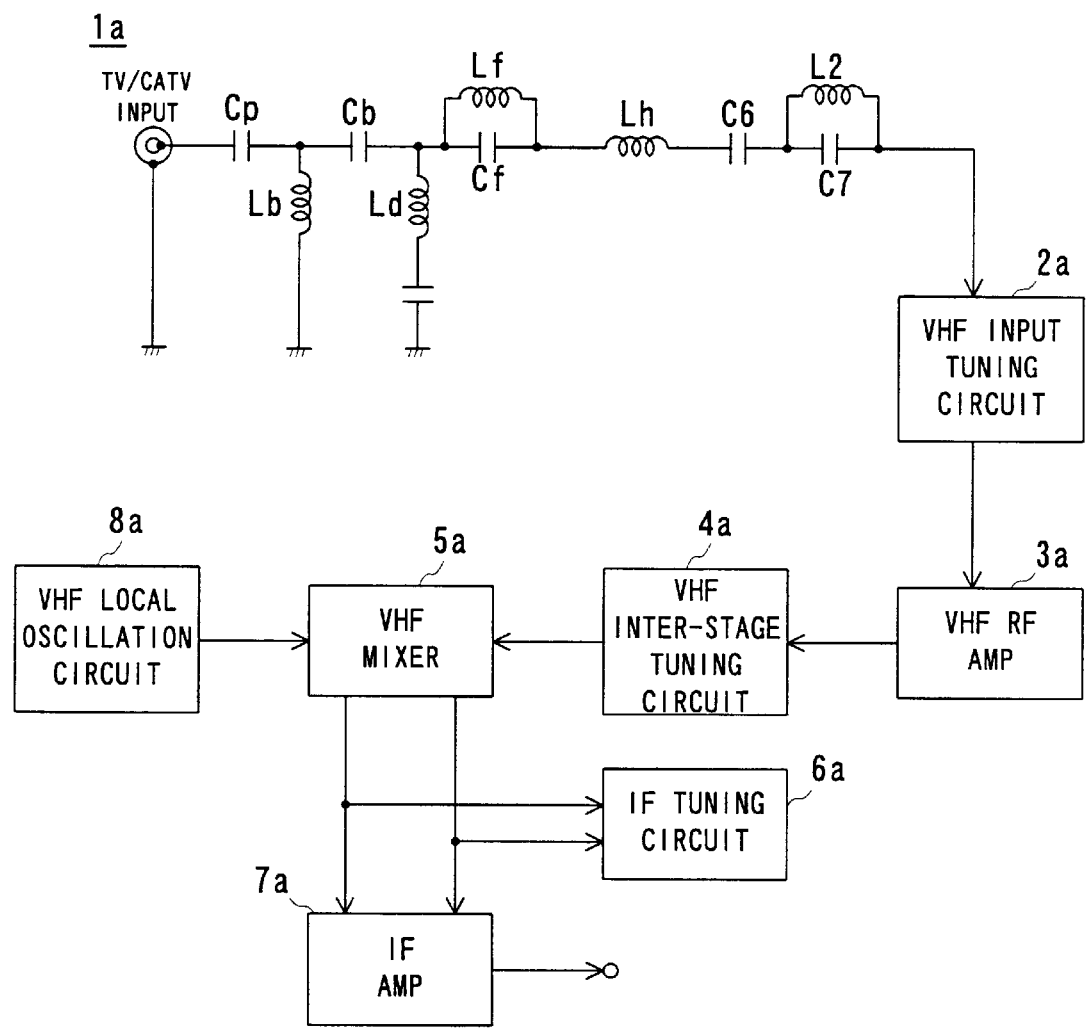
FIG. 5 is a diagram showing a prior art.
Figure 6:
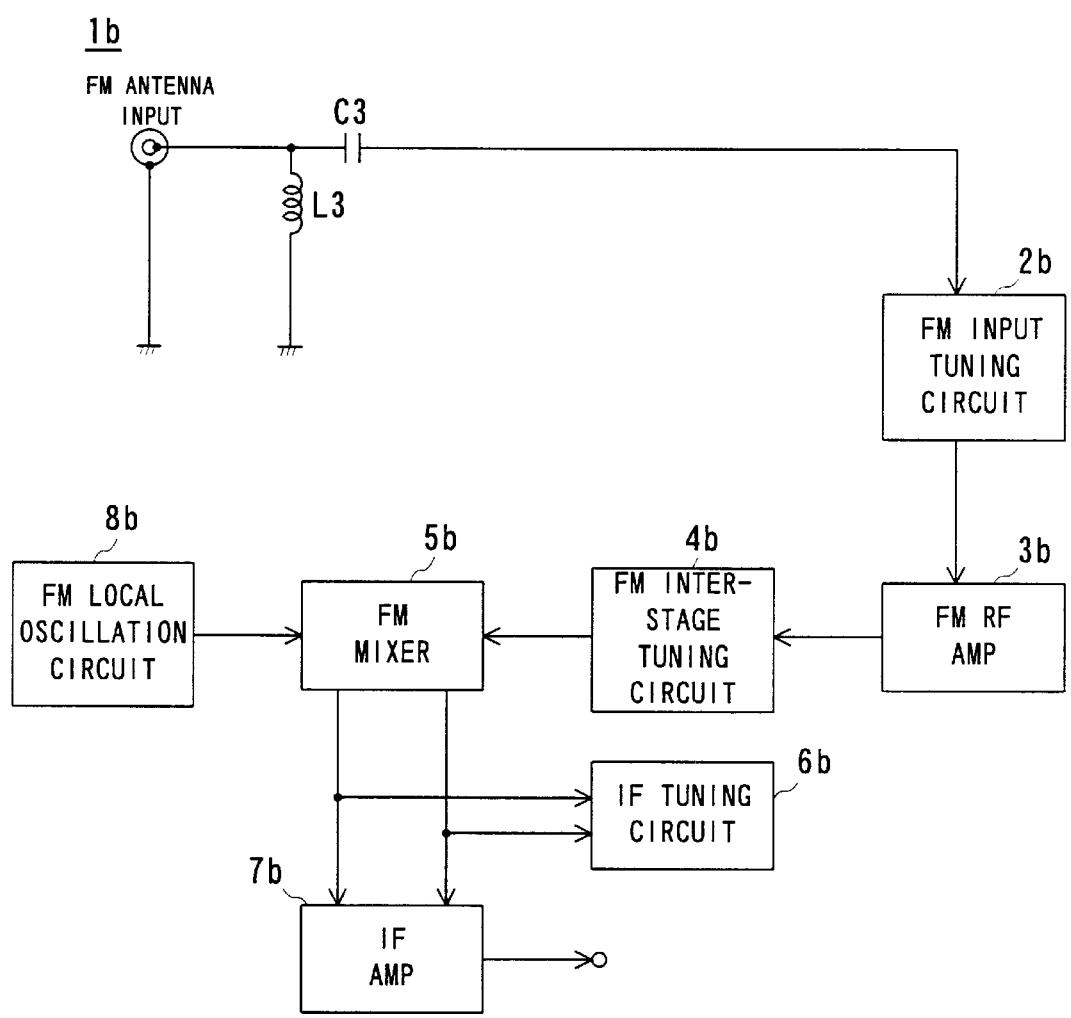
FIG. 6 is a diagram showing another prior art.

As understood from FIG. 2, the tuning band has a band width of 6 MHz. The trap circuit 24 applies trapping to a lower frequency band than a selected FM radio channel, responsive to a tuning voltage. That is, the signal components within this frequency band attenuate due to resonance by the resonant circuit formed by the coil L1, capacitor C5 and variable capacitance diode Dv. The trap band width at this time is approximately 5.9 MHz. The VHF input tuning circuit 12 sets a tuning range such that a selected FM radio channel comes to an upper end of a tuning range. Consequently, only a selected-channel FM radio broadcast signal is outputted from the VHF input tuning circuit 12. Thus, reception is for only a desired-channel FM radio signal, even where the VHF input tuning circuit 12 is broad in tuning band.

Incidentally, the VHF input tuning circuit 12 is given a band switching voltage $V_H$ or $V_L$. For a band switching voltage $V_H$, the VHF input tuning circuit 12 effects tuning in a VHF band of 170 MHz or higher, i.e. in a VHF band range of Japanese ground wave channel "4" or greater. Meanwhile, for a band switching voltage $V_L$, the VHF input tuning circuit 12 effects tuning in a VHF band range of 170 MHz or lower, i.e. in a VHF band range of CATV channel "C22" or smaller.

The VHF television broadcast signal or FM radio broadcast signal tuned by the input tuning circuit 12 is thereafter amplified by an RF amplifier 14 so that an amplified signal is supplied through a VHF inter-stage tuning circuit 15 to a VHF mixer 16. The signal is subjected to frequency conversion by the VHF mixer 16 to provide an IF signal. Incidentally, the VHF input tuning circuit 12, the VHF inter-stage tuning circuit 15 and the VHF local oscillation circuit 17 operate responsive to a tuning voltage.

The VHF mixer 16 outputs not only an IF signal as a differential signal between a broadcast signal and a local oscillation signal but also a sum signal of the broadcast signal and the local oscillation signal. Accordingly, an IF tuning circuit 18 extracts only the IF signal and supplies it to an IF amplifier 20. The IF signal amplified by the IF amplifier 20 is outputted through an output terminal S5. Incidentally, the receiver 10 constructed as above is accommodated within a case having an outside size standardized by IEC.

In this embodiment, for an FM radio broadcast signal the trap circuit 24 causes attenuation in other frequency components than that of a desired channel. Consequently, even if the VHF input tuning circuit 12 is broad in tuning band, it is possible to carry out tuning to a desired FM radio channel. That is, this embodiment can use a common circuit to receive VHF television and FM radio broadcasts, thus achieving cost reduction.

For reference, in U.S.A. ground wave and CATV channels are in the VHF band, as shown in FIG. 4. Also, FM radio channels each having a band width of approximately 200 kHz are provided within a frequency band of from 88 MHz–108 MHz. Due to this, if the receiver 10 of this embodiment is to be used in U.S.A., the trap band of the trap circuit 24 should be changed. Incidentally, although the FM radio channels partly overlap with the CATV channels, there is no especial problem because the television broadcast signal is inputted through the input terminal SI while the radio broadcast signal is inputted through the input terminal S2.

Incidentally, this embodiment inputted the FM radio broadcast signal and the VHF television broadcast signal through different input terminals from each other. Alternatively, the input terminals may be commonly connected to an antenna that can receive both FM radio broadcast and VHF television broadcast. Also, in this embodiment the input terminal S1 inputted only a VHF television broadcast signal. Alternatively, the input terminal S1 may be arranged to input a ground wave broadcast signal and CATV broadcast signal (UHF television broadcast signal) to be aired over a channel provided in a UHF band. In this case, there is necessity to provide an input tuning circuit, RF amplifier, inter-stage tuning circuit, mixer, IF tuning circuit and IF amplifier to process UHF television broadcast signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A receiver, comprising:

a tuning circuit having a first tuning band width;

a first input terminal for inputting a first broadcast signal having a first frequency band width correlated to said first tuning band width;

second input terminal for inputting a second broadcast signal having a second frequency band width narrower than said first frequency band width;

an attenuation circuit for attenuating signal components of only said second broadcast signal at around a desired channel; and a selection circuit for selecting and inputting to said tuning circuit one of said first broadcast signal and said second broadcast signal attenuated in said signal components.

2. A receiver according to claim 1, wherein said attenuation circuit attenuates the signal components over said first frequency band width except for at said desired channel.

3. A receiver according to claim 2, wherein said attenuation circuit includes a resonant circuit which resonates at frequency correlated to a tuning voltage.

4. A receiver according to claim 3, wherein said resonant circuit includes variable capacitor which varies in capacitor depending upon said tuning voltage.

5. A receiver according to claim 1, wherein said first broadcast signal is a television signal to be broadcast in a VHF band range, and said second broadcast signal is a radio signal to be FM broadcast in said VHF band range.

6. A receiver according to claim 1, wherein said first input terminal and said second input terminal are connected to a common antenna.

7. A receiver, comprising:

a tuning circuit having a first tuning band width;

a first input terminal that inputs a first broadcast signal having a first frequency band width correlated to said first tuning band width;

a second input terminal that inputs a second broadcast signal having a second frequency band width narrower than said first frequency band width;

an attenuating circuit that has a fixed attenuation characteristic and attenuates said second broadcast signal input from said second input terminal in the vicinity of a desired channel; and a selecting circuit that selects and inputs one of said first broadcast signal input from said first input terminal and said second broadcast signal output from said attenuating circuit to said tuning circuit.

* * * * *